United States Patent
Ma et al.

(10) Patent No.: US 7,242,077 B2
(45) Date of Patent: Jul. 10, 2007

(54) LEADFRAME WITH DIE PAD

(75) Inventors: Kang-Wei Ma, Kaohsiung (TW); Shu-Chen Yang, Jiouru Township, Pingtung County (TW); Ying-Chen Sun, Ciaotou Township, Kaohsiung County (TW); Li-Ping Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 294 days.

(21) Appl. No.: 11/076,951

(22) Filed: Mar. 11, 2005

(65) Prior Publication Data

US 2005/0199986 A1   Sep. 15, 2005

(30) Foreign Application Priority Data

Mar. 11, 2004   (TW) ............................... 93106548 A

(51) Int. Cl.
   *H01L 23/495*   (2006.01)
(52) U.S. Cl. ...................... 257/670; 257/666; 257/674; 257/E23.031; 257/E23.037; 257/E23.047
(58) Field of Classification Search ...................... None
   See application file for complete search history.

(56) References Cited

U.S. PATENT DOCUMENTS 4,791,472 A * 12/1988 Okikawa et al. ............ 257/669
6,072,228 A * 6/2000 Hinkle et al. ................ 257/666
6,437,427 B1   8/2002 Choi ............................ 257/666
6,501,156 B1 * 12/2002 Nakanishi et al. .......... 257/666
2002/0140064 A1 * 10/2002 Wu et al. .................... 257/670

FOREIGN PATENT DOCUMENTS

TW   424313   3/2001

* cited by examiner

*Primary Examiner*—Jasmine Clark
(74) *Attorney, Agent, or Firm*—Troxell Law Office, PLLC

(57) ABSTRACT

A leadframe includes a die pad, a plurality of tie bars, a plurality of metal extrusions and a plurality of leads. The leads are arranged around the die pad. The tie bars are connected to the corners of the die pad, and the metal extrusions are connected to the sides of the die pad but separated from the tie bars. Each metal extrusion has a locking hole and a bonding surface, which is higher than the die pad. The metal extrusions are configured for improving ground connections by wire-bonding. When a bottom surface of the die pad is exposed from an encapsulant for a semiconductor package, the metal extrusions help to secure the die pad without stress transmission.

21 Claims, 3 Drawing Sheets

LEADFRAME WITH DIE PAD

FIELD OF THE INVENTION

The present invention relates to a leadframe, and more particularly, to a leadframe with a die pad.

BACKGROUND OF THE INVENTION

During the semiconductor assembly process, using leadframes as chip carriers is a well-known technology. As disclosed in R.O.C. Taiwan Patent publication No. 424,313, referring to FIGS. 1 and 2, a known leadframe 10 for semiconductor chip packages comprises a plurality of leads 11, a die pad 12, and a ground ring 13. The die pad 12 is surrounded by the ground ring 13, and the leads 11 are arranged around the die pad 12 and the ground ring 13. The ground ring 13 is connected to the die pad 12 through a plurality of tie bars 14 to provide the grounding connection. In general, the ground ring 13 is adjacent to but separated from the die pad 12. At least one of the bonding wires 30 is used to connect the chip 20 and the ground ring 13. Due to the wider gaps between the die pad 12 and the ground ring 13, the position of the ground ring 13 may shift up and down during the wire bonding process, which leads to poor bonding strength.

In order to solve the problem mentioned above, another known leadframe is designed as revealed in U.S. Pat. No. 6,437,427, which comprises a plurality of inner leads, a die pad, a plurality of first tie bars, a plurality of second tie bars and a ground ring. The inner leads surround the ground ring. The ground ring is adjacent to and connected to the die pad through the first tie bars and the second tie bars. Besides, the second tie bars connect the die pad with the ground ring to avoid poor bonding strength due to wider gaps between the die pad and the ground ring during wire bonding processes. However, the effectiveness of the second tie bars to reduce the position shift of the ground ring during wire bonding processes is very limited. Moreover, the first and second tie bars are bent in order to shape a die pad with downset, the ground ring is vulnerable to twist and deform.

SUMMARY OF THE INVENTION

The main purpose of the present invention is to provide a leadframe including a die pad with a plurality of metal extrusions extending thereof so that at least one of the bonding wires connected to one of the metal extrusions will not shift up or down when wire-bonding.

The second purpose of the present invention is to provide a leadframe on a downset formed by bending the tie bars. A plurality of metal extrusions extend from the die pad without being connected to the tie bars so that the metal extrusions will not be twisted or deformed.

The third purpose of the present invention is to provide a semiconductor package by using a leadframe. A plurality of metal extrusions with locking holes and bonding surfaces extend from the side of a die pad of the leadframe. The metal extrusions are higher than the die pad for wire-bonding connection and encapsulation. Moreover, an encapsulant encapsulates the metal extrusions with the locking holes and the bonding surfaces to increase the adhesion between the die pad and the semiconductor package.

According to the present invention, a leadframe comprises a die pad, a plurality of tie bars, a plurality of metal extrusions and a plurality of leads. The tie bars are connected to the die pad and the leads are arranged around the die pad. Each tie bar has a bent portion to make a downset that the die pad is lower than the leads. The metal extrusions extend from the sides of the die pad without connecting the tie bars. Each metal extrusion has a locking hole and a bonding surface. A plating layer is formed on the bonding surfaces, which are higher than the die pad. For semiconductor packages, the die pad can has a bottom surface exposed from an encapsulant, but the metal extrusions can be sealed by the encapsulant to improve fixation of the die pad without stress transmission

DETAIL DESCRIPTION OF THE INVENTION

Please refer to the attached drawings, the present invention will be described by means of embodiment(s) below.

Figure 1:
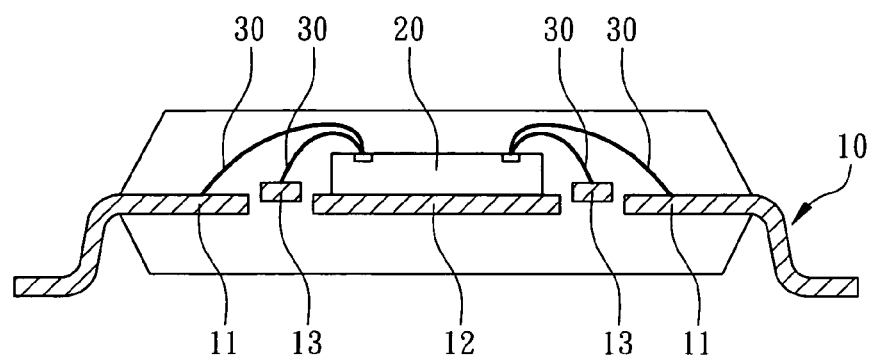
FIG. 1 is a cross-sectional view of a leadframe revealed by the R.O.C. Taiwan Patent No. 424,313.
Figure 2:
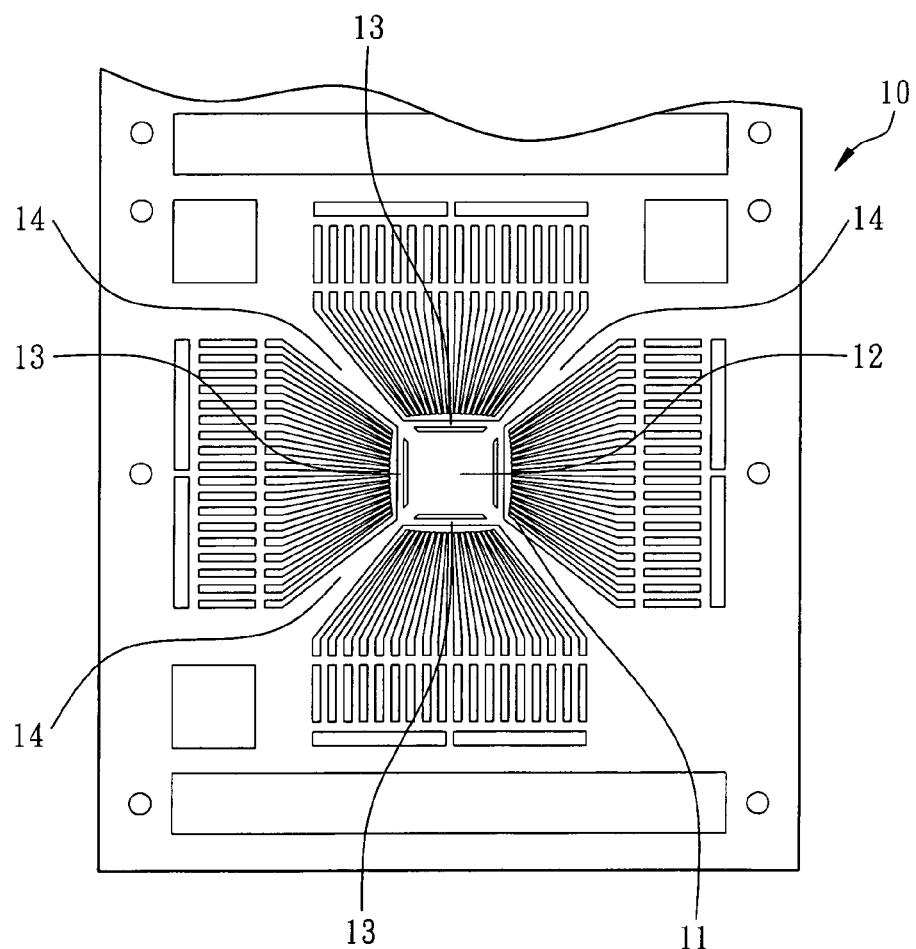
FIG. 2 is a top view of the leadframe revealed by the R.O.C. Taiwan Patent No. 424,313.
Figure 3:
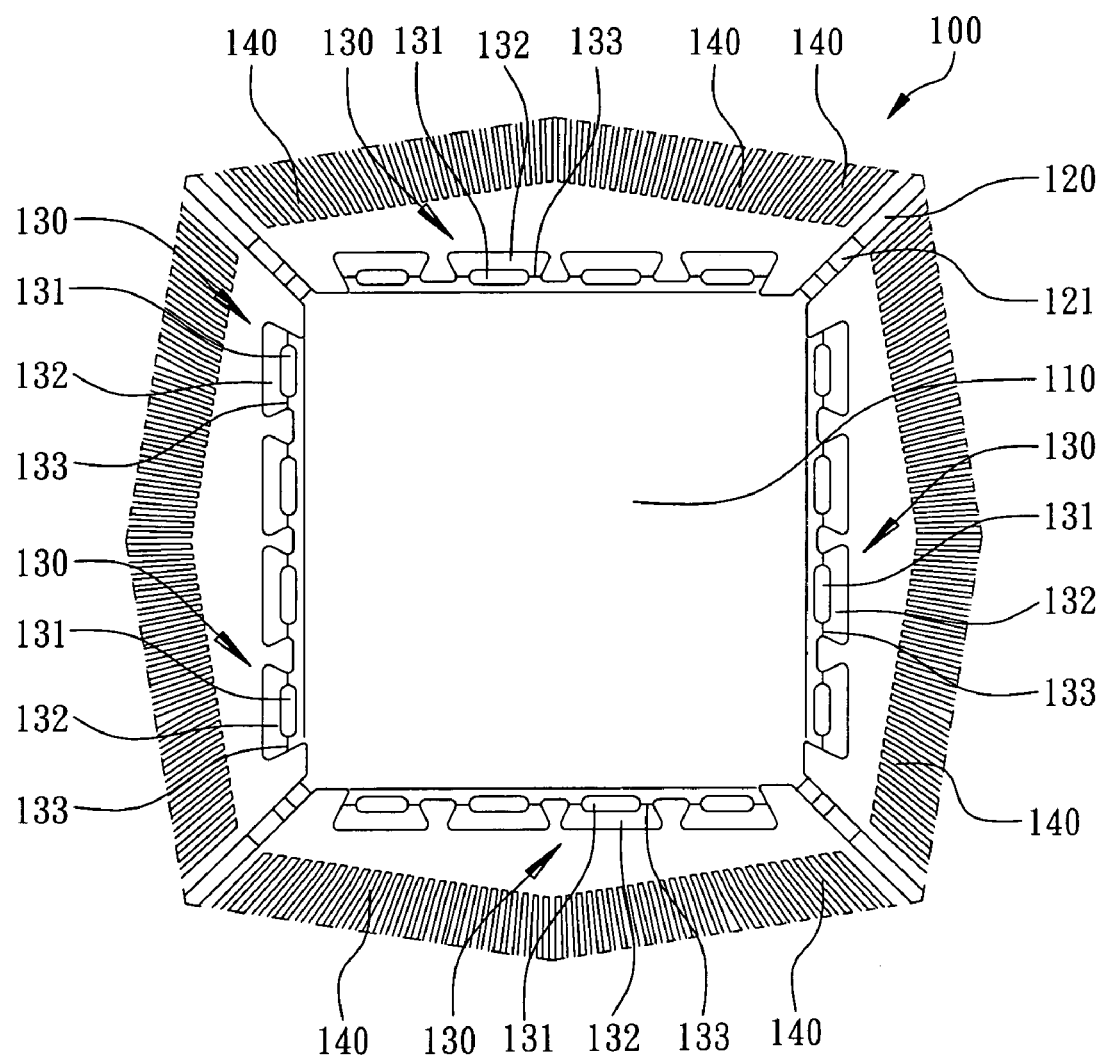
FIG. 3 is a top view of a leadframe according to the preferred embodiment of the present invention.
Figure 4:
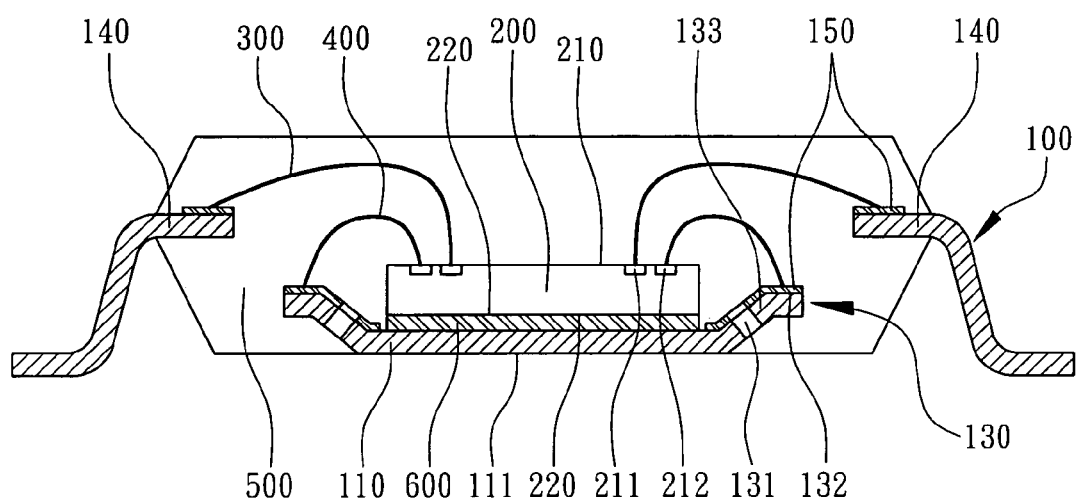
FIG. 4 is a cross-sectional view of a semiconductor package using the leadframe according to the preferred embodiment of the present invention.

In the first embodiment according to the present invention, as shown in FIG. 3, a leadframe 100 comprises a die pad 110, a plurality of tie bars 120, a plurality of metal extrusions 130 and a plurality of leads 140. The leads 140 are arranged around the die pad 110. According to this embodiment, the die pad 110 is rectangular and the tie bars 120 are connected to the corners of the die pad 110. Each tie bar 120 has a bent portion 121 to make a downset so that the die pad 110 is lower than the leads 140. The metal extrusions 130 extend from the sides of the die pad 110 for a ground connection but not connect with the tie bars 120. The metal extrusions 130 are separated from each other and the tie bars 120. Moreover, each metal extrusion has a locking hole 131 and a bonding surface 132. In detail, the locking holes 131 may be through holes penetrating through the metal extrusions 130 or include half-etched cavities in the upper surfaces of the metal extrusions 130. The bonding surfaces 132 are located between the die pad 110 and the leads 140. In general, a plating layer 150 is disposed on the bonding surfaces 132 and the leads 140 for wire-bonding (referring to FIG. 4). The plating layer 150 is made of gold (Au) or silver (Ag). In this embodiment, each metal extrusion 130 is auriculate and has two connection portions 133 connected to the die pad 110 so as to hold the bonding surface 132 of the metal extrusion 130 on a raised plane. Accordingly, the bonding surfaces 132 and the locking holes 131 are higher than the die pad 110. Alternatively, the connection portions 133 can be bent downward so that the bonding surface 132 and the locking hole 131 are lower than the die pad 110 (not shown in the figures).

Since the metal extrusions 130 integrally extend from the sides of the die pad 110 without connecting to the tie bars 120, the position of the metal extrusions 130 will not shift up nor down during wire-bonding so that the bonding strength for ground connection will be better than the conventional leadframe. Moreover, since the metal extrusions 130 are separated from the tie bars 120, when bending the bent portion 121 of the tie bars 120 to make a downset for the die pad 110, the metal extrusions 130 will not be twisted nor deformed.

Please refer to FIG. 4 again, a semiconductor package using the leadframe 100 is also disclosed, which comprises a leadframe 100, a chip 200, a plurality of first bonding wires 300, at least one second bonding wire 400 and an encapsulant 500. The leadframe 100 comprises a die pad 110, a plurality of tie bars 120, a plurality of metal extrusions 130 and a plurality of leads 140 as mentioned above. Besides, each metal extrusion 130 has a locking hole 131 and a bonding surface 132. A plating layer 150 is formed on the bonding surface 132 and the leads 140 for bonding the second bonding wire 400. The chip 200 has an active surface 210 and a back surface 220. A plurality of the first bonding pads 211 and at least a second bonding pad 212 are disposed on the active surface 210 of the chip 200. The first bonding pads 211 and the second bonding pad 212 can be arranged in a single row or multiple rows. According to the embodiment in this invention, the first bonding pads 211 are used for signal transmission and the second bonding pads 212 for power or grounding. A die-attach material 600 or a tape is disposed on the back surface 220 to firmly hold the chip 200 on the die pad 110. The first bonding pads 211 are electrically connected to the leads 140 through the first bonding wires 300, and the second bonding pad 212 is electrically and selectively connected to one of the metal extrusions 130 through the second bonding wire 400. The encapsulant 500 encapsulates not only the chip 220, the first bonding wires 300 and the second bonding wires 400 but also the metal extrusions 130 and the locking holes 132 to increase the fixation of the die pad 110 in the encapsulant 500. The bottom surface 111 of the die pad 110 is exposed from the encapsulant 500 to enhance the heat dissipation capability of the semiconductor package.

The above description of embodiments of this invention is intended to be illustrative and not limiting. Other embodiments of this invention will be obvious to those skilled in the art in view of the above disclosure.

What is claimed is:

1. A leadframe for used in semiconductor packages, comprising:
    a die pad;
    a plurality of tie bars connected to the die pad;
    a plurality of metal extrusions extending from the die pad, wherein each metal extrusion has a locking hole and a bonding surface; and
    a plurality of leads arranged around the die pad.

2. The leadframe of claim 1, wherein the metal extrusions are formed between and separated from the tie bars.

3. The leadframe of claim 1, wherein the locking holes penetrate through the metal extrusions.

4. The leadframe of claim 1, wherein the locking holes include a plurality of half-etched cavities in the metal extrusions.

5. The leadframe of claim 1, wherein each metal extrusion has two connection portions connected to the die pad.

6. The leadframe of claim 1, wherein the bonding surfaces of the metal extrusions are higher than the die pad.

7. The leadframe of claim 1, wherein the tie bars have a plurality of bent portions to make a downset so that the die pad is lower than the leads, and the bonding surfaces of the metal extrusions are located between the die pad and the leads.

8. The leadframe of claim 1, further comprising a plating layer formed on the bonding surfaces.

9. The leadframe of claim 1, wherein the die pad is rectangular, and the tie bars are connected to corners of the die pad, and the metal extrusions extend from sides of the die pad.

10. A semiconductor package comprising:
    a die pad;
    a plurality of tie bars connected to the die pad;
    a plurality of metal extrusions extending from the die pad, wherein each metal extrusion has a locking hole and a bonding surface;
    a plurality of leads arranged around the die pad;
    a chip having an active surface and a back surface and including a plurality of first bonding pads and at least a second bonding pad on the active surface, wherein the back surface is attached to the die pad;
    a plurality of first bonding wires connecting the first bonding pads with the leads;
    at least a second bonding wire connecting the second bonding pad with one of the bonding surfaces of the metal extrusions; and
    an encapsulant encapsulating the chip, the first bonding wires, the second bonding wire, and the metal extrusions.

11. The package of claim 10, wherein the locking holes of the metal extrusions are filled with the encapsulant.

12. The package of claim 10, wherein the die pad has a bottom surface exposed from the encapsulant.

13. The package of claim 10, wherein the metal extrusions are formed between and separated from the tie bars.

14. The package of claim 10, wherein each metal extrusion has two connection portions connected to the die pad.

15. The package of claim 10, wherein the bonding surfaces of the metal extrusions are higher than the die pad.

16. The package of claim 10, further comprising a plating layer formed on the bonding surfaces of the metal extrusions.

17. The package of claim 10, wherein the tie bars have a plurality of bent portions to make a downset so that the die pad is lower than the leads, and the bonding surfaces of the metal extrusions are located between the die pad and the leads.

18. A leadframe comprising a plurality of leads, a die pad with a plurality of metal extrusions, wherein each metal extrusion has a locking hole and a bonding surface, and the metal extrusions extend from sides of the die pad.

19. The leadframe of claim 18, further comprising a plurality of tie bars connected to corners of the die pad.

20. The leadframe of claim 18, wherein the bonding surfaces of the metal extrusions are higher than the die pad.

21. The leadframe of claim 18, further comprising a plating layer formed on the bonding surfaces of the metal extrusions.

* * * * *